(12) United States Patent
Bayerer

(10) Patent No.: US 9,622,341 B2
(45) Date of Patent: Apr. 11, 2017

(54) POWER SEMICONDUCTOR MODULE SYSTEM HAVING A HIGH ISOLATION STRENGTH AND METHOD FOR PRODUCING A POWER SEMICONDUCTOR MODULE ARRANGEMENT HAVING A HIGH ISOLATION STRENGTH

(71) Applicant: Infineon Technologies AG, Neubiberg (DE)

(72) Inventor: Reinhold Bayerer, Reichelsheim (DE)

(73) Assignee: Infineon Technologies AG, Neubiberg (DE)

( * ) Notice: Subject to any disclaimer, the term of this patent is extended or adjusted under 35 U.S.C. 154(b) by 64 days.

(21) Appl. No.: 14/809,714

(22) Filed: Jul. 27, 2015

(65) Prior Publication Data
US 2016/0029478 A1 Jan. 28, 2016

(30) Foreign Application Priority Data
Jul. 28, 2014 (DE) .......... 10 2014 110 617

(51) Int. Cl.
| | |
|---|---|
| G06F 1/16 | (2006.01) |
| H05K 5/00 | (2006.01) |
| H05K 7/00 | (2006.01) |
| H05K 1/02 | (2006.01) |
| H05K 1/18 | (2006.01) |
| H05K 3/30 | (2006.01) |
| H01L 23/04 | (2006.01) |

(52) U.S. Cl.
CPC .......... *H05K 1/0256* (2013.01); *H01L 23/04* (2013.01); *H05K 1/181* (2013.01); *H05K 3/30* (2013.01); *H01L 2924/0002* (2013.01); *H05K 2201/0761* (2013.01); *H05K 2201/09036* (2013.01)

(58) Field of Classification Search
CPC .......... H05K 1/0256; H05K 1/181; H05K 3/30
USPC ........ 361/704, 707, 736, 752, 699; 257/678, 257/706, 713, 714, 704, 710, 715; 363/141, 132, 144, 147, 17, 65, 16, 131
See application file for complete search history.

(56) References Cited

U.S. PATENT DOCUMENTS

| | | | | |
|---|---|---|---|---|
| 6,078,501 A | * | 6/2000 | Catrambone | H02M 7/003 174/50 |
| 6,212,087 B1 | * | 4/2001 | Grant | H02M 7/003 361/707 |
| 6,845,017 B2 | * | 1/2005 | Ahmed | H01L 23/50 257/691 |
| 6,987,670 B2 | * | 1/2006 | Ahmed | H01L 24/49 165/80.4 |

(Continued)

*Primary Examiner* — Anthony Haughton
(74) *Attorney, Agent, or Firm* — Murphy, Bilak & Homiller, PLLC

(57) ABSTRACT

A power semiconductor module includes a module housing having a top side, a first terminal group, and a second terminal group. A circuit board, which has a first electrode and a second electrode, is mountable on the power semiconductor module in such a way that in the mounted state each terminal of the first group is electrically conductively connected to the first electrode and each terminal of the second group is electrically conductively connected to the second electrode. A first isolation web and/or a second isolation web is provided. Each isolation web is fixed to the circuit board even in the unmounted state, and arranged between the first terminal group and the second terminal group in the mounted state.

19 Claims, 10 Drawing Sheets

(56) References Cited

U.S. PATENT DOCUMENTS

| | | | | |
|---|---|---|---|---|
| 7,289,329 B2* | 10/2007 | Chen | ............... | H01F 27/2804 |
| | | | | 165/185 |
| 7,505,294 B2* | 3/2009 | Ahmed | ............ | H02M 7/003 |
| | | | | 363/132 |
| 7,656,672 B2* | 2/2010 | Schilling | ............ | H01L 24/49 |
| | | | | 361/736 |
| 7,821,792 B2* | 10/2010 | Belady | ................ | H05K 1/14 |
| | | | | 361/679.01 |
| 8,198,712 B2* | 6/2012 | Zhuang | ............... | H01L 23/04 |
| | | | | 257/678 |
| 8,743,552 B2* | 6/2014 | Tian | ................. | G06F 3/0658 |
| | | | | 361/679.31 |
| 8,837,117 B2* | 9/2014 | Merlet | ............. | H05K 1/0263 |
| | | | | 174/250 |

* cited by examiner

POWER SEMICONDUCTOR MODULE SYSTEM HAVING A HIGH ISOLATION STRENGTH AND METHOD FOR PRODUCING A POWER SEMICONDUCTOR MODULE ARRANGEMENT HAVING A HIGH ISOLATION STRENGTH

PRIORITY CLAIM

This application claims priority to German Patent Application No. 10 2014 110 617.2 filed on 28 Jul. 2014, the content of said application incorporated herein by reference in its entirety.

TECHNICAL FIELD

The present invention relates to power semiconductor modules, and more particularly to power semiconductor modules having a high isolation strength.

BACKGROUND

Between the electrical terminals of power semiconductor modules there are often very high potential differences present, which entails the risk of voltage flashovers. Therefore, it is necessary to maintain sufficient creepage clearances, the minimum length of which depends on the highest occurring potential difference and the expected degree of contamination of the module surface situated between the terminals. In principle, it is known, in the case of a semiconductor module, to lengthen the creepage paths by means of suitable measures; however, mounting a circuit board on the power semiconductor module can lead to an impermissibly high creepage current or even a voltage flashover along the circuit board. A planar circuit board shortens again for example the creepage paths present on the module as a result of trenches or webs. Although the problem mentioned can be combated to a certain degree by means of a large distance between the electrical terminals, this increases the inductance between the lines connected to the electrical terminals, since the distance between said lines—at least in the region of the terminals—must likewise be increased. However, an increased inductance is disadvantageous primarily in the case of rapidly switching applications such as in the case of converters, for example, because impermissibly high induced voltages can occur on account of great changes in current with respect to time.

SUMMARY

Embodiments described herein provide a power semiconductor module system and a method for producing a power semiconductor module arrangement in which voltage flashovers and impermissibly high creepage currents or impermissibly short creepage paths along a path mounted or mountable on the power semiconductor module are avoided.

A first aspect concerns a power semiconductor module system comprising a power semiconductor module, a first terminal group, a second terminal group and a circuit board. The power semiconductor module has a module housing having a top side, a first terminal group comprising at least one first electrical terminal, and also a second terminal group comprising at least one second electrical terminal.

If the first terminal group has at least two first electrical terminals, these first electrical terminals are permanently electrically conductively connected to one another. The same correspondingly applies to the second terminal group, that is to say that if the latter has at least two second electrical terminals, these second electrical terminals are permanently electrically conductively connected to one another.

The circuit board, which has a first electrode and a second electrode is mountable on the power semiconductor module in such a way that in the mounted state each of the first terminals is electrically conductively connected to the first electrode and that each of the second terminals is electrically conductively connected to the second electrode.

The power semiconductor module system furthermore has a first isolation web and/or a second isolation web. If a first isolation web is present, it is fixed to the circuit board even in the unmounted state, and it is arranged between the first terminal group and the second terminal group in the mounted state. Correspondingly a second isolation web, if present, is fixed to the circuit board even in the unmounted state and it is arranged between the first terminal group and the second terminal group in the mounted state on that side of the circuit board which faces away from the power semiconductor module.

Within the meaning of the present application, a "mounted state" is present whenever the circuit board is fixedly fitted on the semiconductor module in such a way that all first terminals are electrically conductively connected to the first electrode and all second terminals are electrically conductively connected to the second electrode. Otherwise, an "unmounted state" is present.

A second aspect concerns a method for producing a power semiconductor module arrangement. For this purpose, a power semiconductor module system embodied in accordance with the first aspect is provided, and its circuit board is mounted on the power semiconductor module in such a way that in the mounted state each of the first terminals is electrically conductively connected to the first electrode and that each of the second terminals is electrically conductively connected to the second electrode.

Those skilled in the art will recognize additional features and advantages upon reading the following detailed description, and upon viewing the accompanying drawings.

BRIEF DESCRIPTION OF THE DRAWINGS

The invention is explained below on the basis of exemplary embodiments with reference to the accompanying figures. Unless indicated otherwise, identical reference signs designate identical or identically acting elements having an identical function. It is pointed out that the illustration in the figures is not to scale. In the figures.

DETAILED DESCRIPTION

Figure 1:
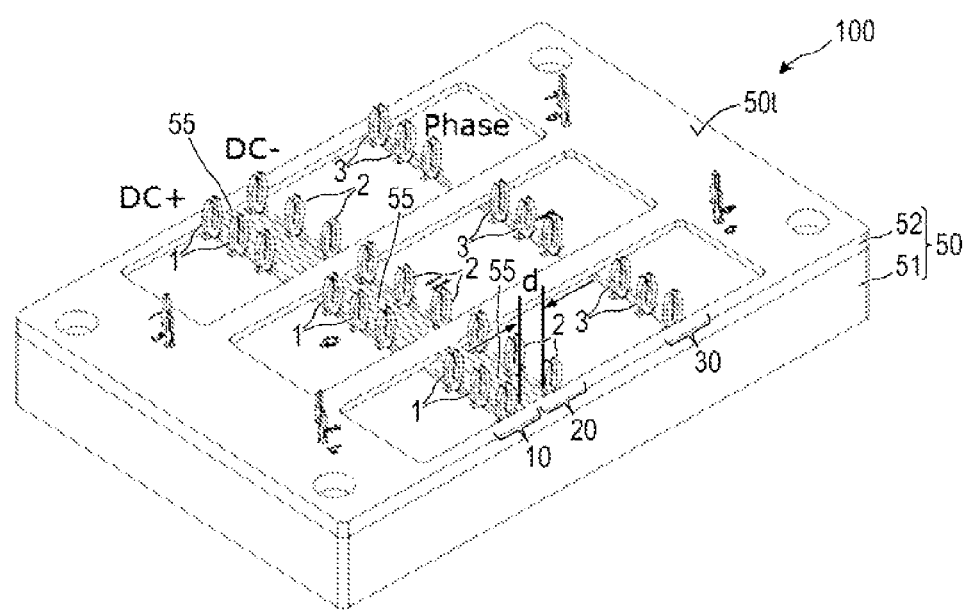
FIG. 1 shows a perspective view of a power semiconductor module comprising a first terminal group and a second terminal group.

FIG. 1 shows a power semiconductor module 100 comprising a module housing 50. The module housing 50 can be configured in any desired fashion. It can consist in particular of an electrically insulating material, for example of plastic. The module housing 50 can be embodied in an integral fashion, or else be composed of two or more housing parts. In the example shown, the module housing 50 has a ring-shaped housing frame 51, onto which an optional housing cover 52 is placed. In all events, the module housing 50 has a top side 50t, at which a plurality of terminal groups 10, 20, 30 comprising in each case one or a plurality of electrical terminals 1, 2 and 3, respectively, are exposed outside the module housing 50.

In the case of each of the terminal groups 10, 20, 30, the associated electrical terminals 1, 2 and 3, respectively, are permanently electrically conductively connected to one another for example by electrical connection lines in the interior of the module housing 50. The first terminal group 10 therefore contains one or at least two first electrical terminals 1. In the case of at least two first electrical terminals 1, the latter are permanently electrically conductively connected to one another. Correspondingly, the second terminal group 20 contains one or at least two second electrical terminals 2, which in the case of at least two second electrical terminals 2 are permanently electrically conductively connected to one another, and the third terminal group 30 contains one or at least two third electrical terminals 3, which in the case of at least two third electrical terminals 3 are permanently electrically conductively connected to one another.

In principle, a power semiconductor module 100 has at least two terminal groups 10, 20, 30. Between two of the terminal groups 10, 20, 30—these being the terminal groups 10 and 20 merely by way of example in the case of the present power semiconductor module 100—the module housing 50 has an optional trench 55, which extends into the module housing 50 proceeding from the top side 50t between said terminal groups 10 and 20. A corresponding trench can optionally also be arranged between the terminal groups 20 and 30. This will be the case, in particular, if the terminal groups 10 and 30 and/or 20 and 30 are closely adjacent, since the leakage induction between all three terminal groups 10, 20 and 30 is intended to be low.

Figure 2:
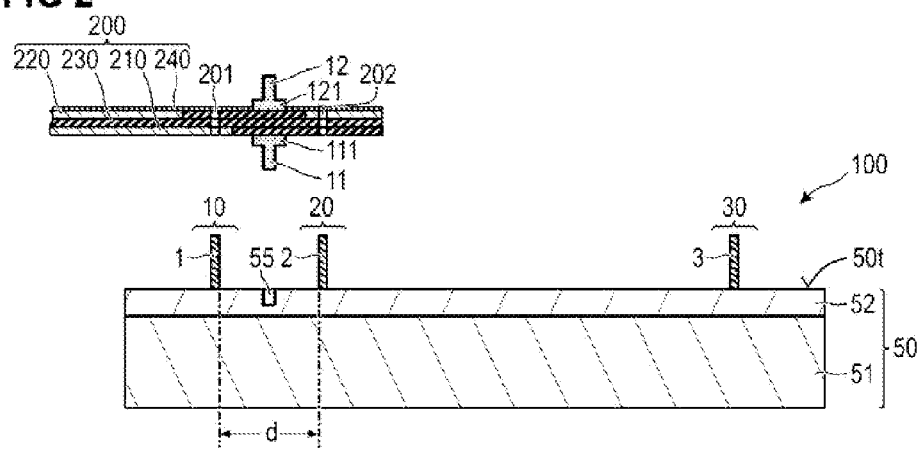
FIG. 2 shows a sectional view of a power semiconductor module arrangement before a circuit board provided with two isolation webs is mounted on a power semiconductor module.

FIG. 2 shows a sectional view of a power semiconductor module arrangement before a circuit board 200 provided with two isolation webs 11, 12 is mounted on a power semiconductor module 100.

The sectional illustration through the power semiconductor module 100 is only schematic insofar as the components situated in the interior of the module housing 50 are shown. The hatching of the module housing 50 is intended only to express the fact that a sectional illustration is involved. In this case, the sectional plane also runs through the trench 55 and through electrical terminals 1, 2 and 3 and through the circuit board 200 and the isolation webs 11 and 12 mounted thereon.

At least one of two dielectric isolation webs 11 and 12 is fixed to the circuit board 200, which has a dielectric isolation carrier 230 and also a first electrode 210 and a second electrode 220, specifically as early as before the circuit board 200 is mounted on the power semiconductor module 100. The first electrode 210 and the second electrode 220 are electrically isolated from one another by the dielectric isolation carrier 230. The first electrode 210 and the second electrode 220 can be embodied for example completely or at least predominantly as flat metal foils. The latter can run parallel. By way of example, the circuit board 200 can be a waveguide in which the first electrode 210 and the second electrode 220 are substantially embodied as parallel metal foils which are connected to the isolation carrier 230 cohesively and in a planar fashion (e.g. as a parallel-plate waveguide). In order to obtain a low electrical resistance, the electrodes 210, 220 can consist for example completely or predominantly of copper. However, other electrically conductive materials can likewise be used. Printed circuit board 200 is understood in particular also to include arrangements in which the first electrode 210 and the second electrode 220 are embodied as solid bus bars.

As is likewise shown in FIG. 2, the circuit board 200 can optionally have an electrically insulating cover 240, for example an insulating lacquer, an insulating film, etc., at its side facing away from the power semiconductor module 100.

In the mounted state, without the isolation webs 11, 12, the creepage path on the circuit board 200 would be formed by the electrode 210, insofar as it is exposed at the through hole 201 (at the top and bottom), and the electrode 220, insofar as it is exposed at the through hole 202 (at the top and bottom). In general, said creepage path is still shorter than the free distance (air path) between the terminals on the power semiconductor module 100 since the module terminals 1, 2, 3 may still be surrounded by exposed sleeves or plated-through holes in the circuit board 200 and soldering lands on both sides of the circuit board 200. If mention is made of creepage paths between terminal groups 10, 20, 30 in the mounted state, then the relevant indications relate to the creepage paths which are present between the corresponding terminal groups 10, 20, 30 including the sleeves, plated-through holes and soldering lands that are electrically conductively connected to the relevant terminal group 10, 20, 30 (provided that such sleeves, plated-through holes and soldering lands are present).

Figure 3:
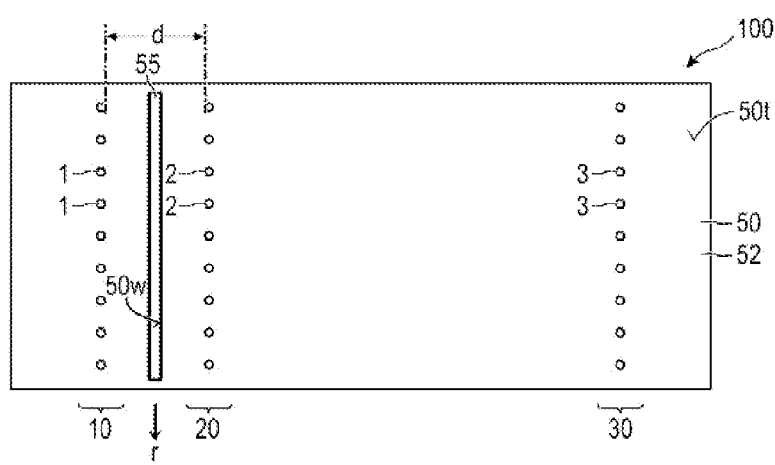
FIG. 3 shows a plan view of the power semiconductor module in accordance with FIG. 2.

FIG. 3 shows a plan view of the power semiconductor module in accordance with FIG. 2. It can be discerned here that the electrical terminals 1, 2, 3 in each of the terminal groups 10, 20 and 30, respectively, can optionally be arranged in a series one behind another and that in this case the series of the electrical terminals 1, 2, 3 of at least two of the terminal groups 10, 20, 30 can run parallel to one another.

It can furthermore be discerned that the trench 55 can extend in its course direction r at least over the full length of the series of the terminal groups 10 and 20 between which said trench runs.

As can additionally be gathered from FIG. 3, the trench 55 can optionally have a side wall 55w that is formed by the module housing 50 and is closed in a ring-shaped fashion.

Figure 4:
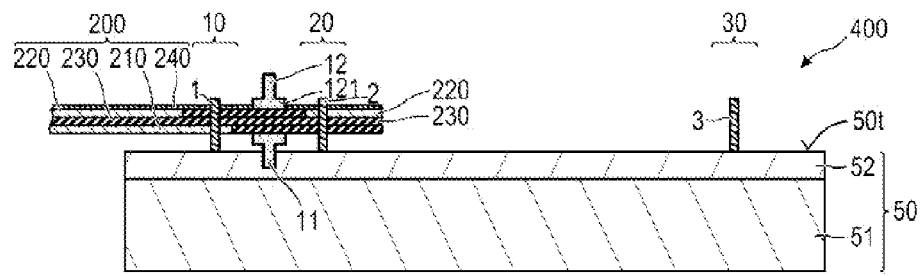
FIG. 4 shows a sectional view of the power semiconductor module arrangement in accordance with FIG. 2 after the circuit board provided with the two isolation webs has been mounted on the power semiconductor module.

FIG. 4 shows the power semiconductor module arrangement 400 that arises by virtue of the fact that the circuit board 200 equipped with the at least one isolation web 11, 12 is mounted on the power semiconductor module 100. If there is present in this case a first isolation web 11 mounted on that side of the circuit board 200 which faces the power semiconductor module 100, said isolation web is arranged between those of the terminal groups 10, 20 between which the trench 55 is also situated, and engages into the trench 55. If the trench 55 in this case has a side wall 55w that is closed in a ring-shaped fashion, said side wall 55w surrounds the first isolation web 11 in a ring-shaped fashion. If in this case there is present a second isolation web 12 mounted on that side of the circuit board 200 which faces away from the power semiconductor module 100, said isolation web is arranged between the terminal groups 10 and 20.

In the mounted state, therefore, the first isolation web 11 and second isolation web 12—provided that they are present—are arranged between the first terminal group 10 and the second terminal group 20, which brings about a lengthening of the creepage clearance between the first terminal group 10 and the second terminal group 20.

The manner in which the isolation webs 11, 12 are mounted on the circuit board 200 is arbitrary, in principle. They can be adhesively bonded, hooked, clamped, screwed or riveted onto the circuit board 200, for example. Optionally, an adhesive bond using an electrically insulating adhesive, for example a silicone adhesive, may always be present, which completely seals a gap between the relevant isolation web 11, 12 and the circuit board 200 in order to avoid creepage currents which might otherwise form between the first terminal group 10 and the second terminal group 20 through the gap.

As can additionally be discerned with reference to FIGS. 2 and 4, an isolation web 11, 12 mounted on the circuit board 200 can optionally have a flange 111 and 121, respectively, at its side facing the circuit board 200, in order to enlarge the respective adhesive area.

When the circuit board 200 is mounted on the power semiconductor module 100, the first electrical terminals 1 are in all events electrically conductively contacted with the first electrode 210, and the second electrical terminals 2 with the second electrode 220.

In the present example, the electrical terminals 1, 2 and 3, illustrated only schematically in FIG. 2, are embodied as so-called press-fit terminals in accordance with DIN 41611-9:1987-12: "Solderless electrical connections; wrapped connections, without wire stripping; terms and definitions, ratings, requirements, tests", or in accordance with DIN EN (IEC) 60352-5, 2008-11: "Solderless connections—Part 5: Press-fit connections—General requirements, test procedures and application notes (IEC 60352-5:2008)", both obtainable from Beuth Verlag GmbH, Berlin.

As an alternative to press-fit contacts, the electrical terminals 1, 2, 3 could also be embodied as soldering terminals, wherein in the mounted state of the circuit board 200 on the power semiconductor module 100 the first electrical terminal or electrical terminals 1 is or are soldered to the first electrode 210, and the second electrical terminals 2 to the second electrode 220.

Likewise, the electrical terminals 1, 2, 3 can also be embodied as welding terminals, wherein in the mounted state of the circuit board 200 on the power semiconductor module 100 the first electrical terminal or electrical terminals 1 is or are welded to the first electrode 210, and the second electrical terminals 2 to the second electrode 220.

Furthermore, the electrical terminals 1, 2, 3 can also be embodied as screw terminals, wherein in the mounted state of the circuit board 200 on the power semiconductor module 100 the first electrical terminal or electrical terminals 1 is or are screwed to the first electrode 210, and the second electrical terminals 2 to the second electrode 220.

Moreover, the electrical terminals 1, 2, 3 can also be embodied as spring contacts, wherein in the mounted state of the circuit board 200 on the power semiconductor module 100 the first electrical terminal or electrical terminals 1 is or are pressed against the first electrode 210 resiliently and with formation of an electrical pressure contact connection, and wherein the second electrical terminal or electrical terminals 2 is or are pressed against the second electrode 220 resiliently and with formation of an electrical pressure contact connection.

Figure 5:
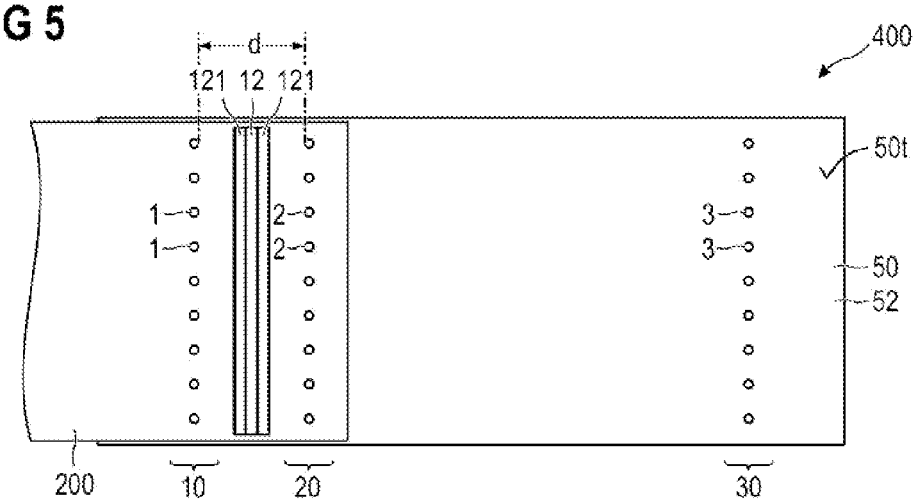
FIG. 5 shows a plan view of the power semiconductor module arrangement in accordance with FIG. 4.

FIG. 5 shows a plan view of the power semiconductor module arrangement 400 in accordance with FIG. 4. As can be discerned with reference to FIGS. 4 and 5, in the mounted state portions of the electrical terminals 1 and 2 respectively electrically conductively connected to the electrodes 210 and 220 can be situated on that side of the circuit board 200 which faces away from the power semiconductor module 100. It is likewise possible, however, that the electrical terminals 1 and 2 even in the mounted state are arranged completely on that side of the circuit board 200 which faces the power semiconductor module 100, or at least do not extend beyond that side of the circuit board 200 which faces away from the power semiconductor module 100.

Figure 6:
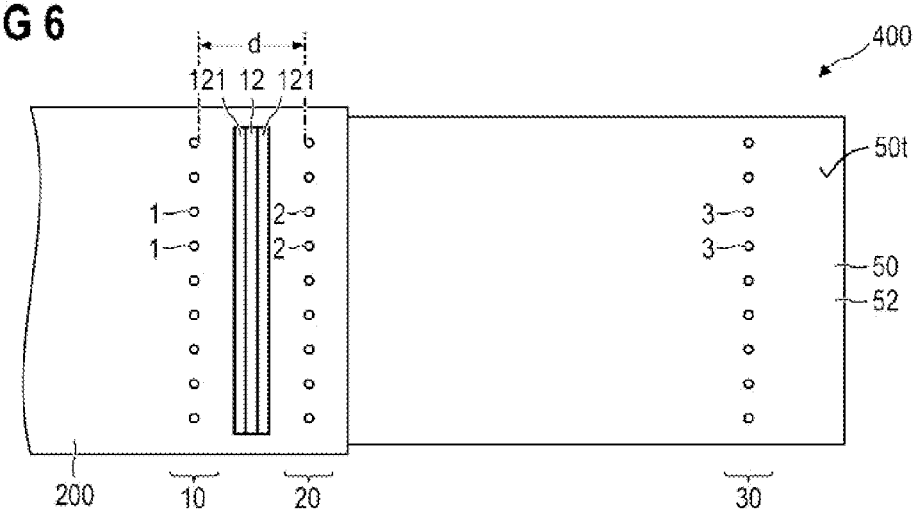
FIG. 6 shows a plan view of a further power semiconductor module arrangement, in which the circuit board has a greater width than the power semiconductor module.

As is likewise evident from FIG. 5, the power semiconductor module 100 can have a larger or, as is illustrated in FIG. 6, a smaller width than the circuit board 200 in the mounted state in the course direction r of the trench 55 (see FIG. 3) at least in the region of the trench 55. Likewise, the circuit board 200 can have a width identical to the width of the power semiconductor module 100 in the mounted state in the course direction r of the trench 55 at least in the region of the trench 55.

Figure 7:
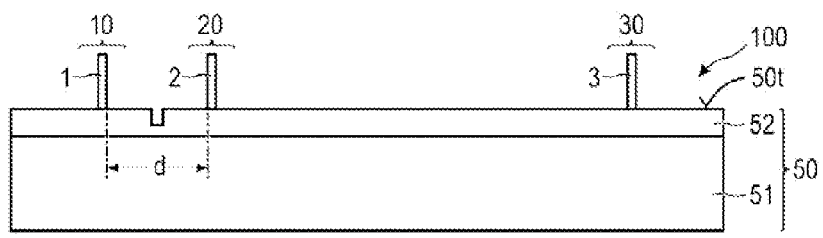
FIG. 7 shows a plan view of a power semiconductor module in which a trench running between two terminal groups in the module housing extends completely through the module housing.
Figure 8:
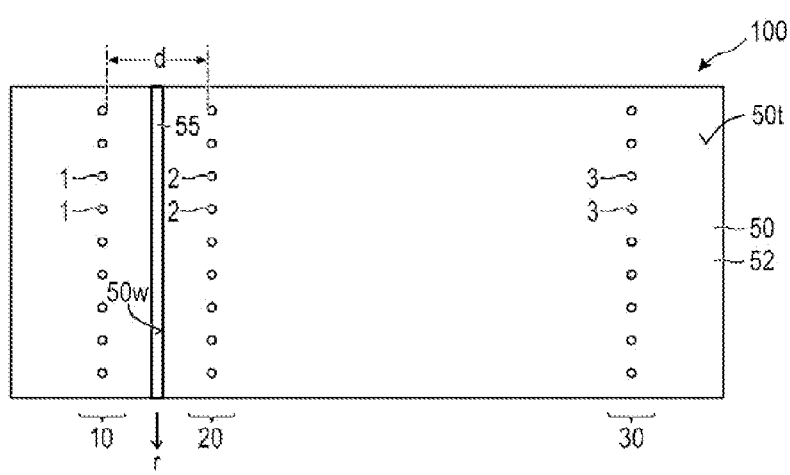
FIG. 8 shows a side view of the power semiconductor module in accordance with FIG. 7.

FIG. 7 shows a plan view of a power semiconductor module 100 that differs from the power semiconductor module 100 in accordance with FIG. 3 only in that the trench 55 extends completely through the module housing 50 in its course direction r. The trench 55 is therefore delimited by the module housing 50 neither in nor counter to its course direction r. A side view of the semiconductor module in accordance with FIG. 7 is shown in FIG. 8.

Figure 9:
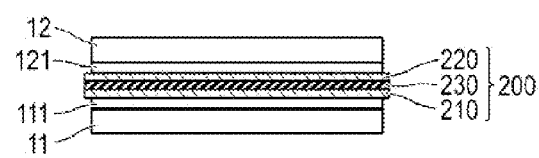
FIG. 9 shows a sectional view of a circuit board having two isolation webs mounted thereon, the length of which is smaller than the width of the circuit board.
Figure 10:
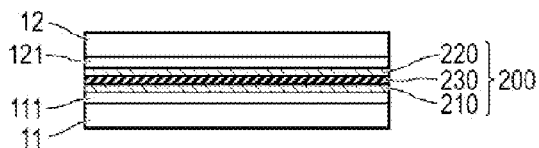
FIG. 10 shows a sectional view of a circuit board having two isolation webs mounted thereon, the length of which corresponds to the width of the circuit board.
Figure 11:
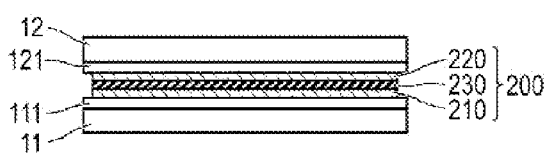
FIG. 11 shows a sectional view of a circuit board having two isolation webs mounted thereon, the length of which is larger than the width of the circuit board.

As is furthermore shown in FIGS. 9, 10 and 11, an isolation web 11, 12 can have in its course direction a length which is smaller than the width of the circuit board 200, such that the circuit board 200 projects beyond the isolation web 11, 12 (FIG. 9), or which is identical to the width of the circuit board 200, such that the isolation web 11, 12 terminates flush with the circuit board 200 at its two opposite ends (FIG. 10), or which is greater than the width of the circuit board 200, such that the isolation web 11, 12 projects beyond the circuit board 200 (FIG. 11).

Figure 12A:
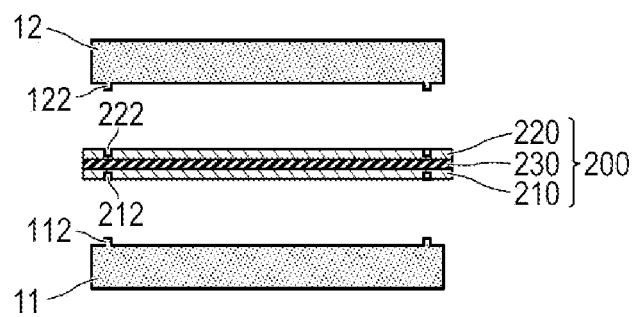
FIG. 12A shows a sectional view of a circuit board and of two isolation webs to be mounted on the circuit board, said isolation webs each having alignment pins.
Figure 12B:
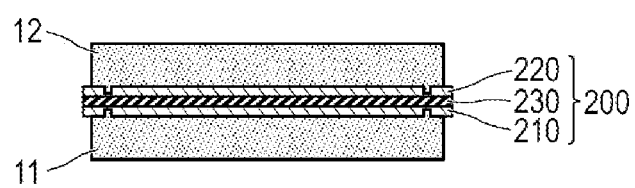
FIG. 12B shows a sectional view of the circuit board in accordance with FIG. 12A after the isolation webs have been mounted on the circuit board, wherein the alignment pins respectively engage into an alignment opening of the circuit board.

In accordance with a further option, which is illustrated with reference to FIGS. 12A and 12B and which can be provided in the case of one or both isolation webs 11, 12 (if present), a first isolation web 11 can have first alignment pins 112 and a second isolation web 12 can have second alignment pins 122, which respectively engage into a corresponding element opening 212 and 222 of the circuit board 200 after the relevant isolation web 11, 12 has been fixed to the circuit board 200. FIGS. 12A and 12B show the isolation webs 11 and 12 before and respectively after the fixing thereof to the circuit board 200. It goes without saying that such alignment pins of an isolation web 11, 12 that engage into alignment openings 212, 222 of the circuit board 200 can be realized even if only one of the isolation webs 11, 12 is present.

Figure 13A:
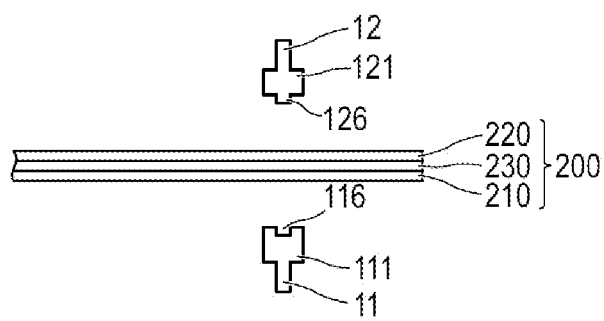
FIG. 13A shows a side view of a circuit board having a pair of isolation webs, said circuit board comprising two isolation webs to be mounted on the circuit board of which one comprises a groove and the other a spring.
Figure 13B:
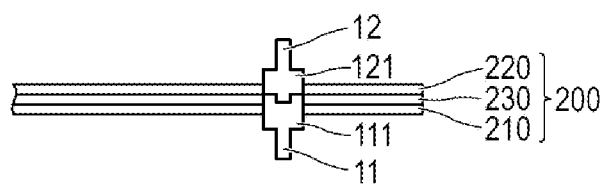
FIG. 13B shows the parts in accordance with FIG. 13A after the isolation webs of the pair of isolation webs have been mounted on the circuit board in such a way that the spring engages in the groove.

If a first and a second isolation web 11 and 12 are present, an arbitrary one of them can have a groove 116, and the other a spring 126, which engages into the groove 116 after both isolation webs 11 and 12 have been fixed to the circuit board 200 which is evident in FIGS. 13A and 13B, which show the circuit board 200 before and after the fixing of the isolation webs 11 and 12.

Figure 14A:
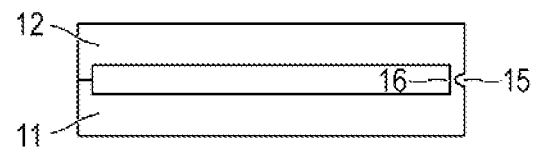
FIG. 14A shows a side view of two isolation webs connected to one another movably in a state in which they form a unit closed in a ring-shaped fashion.

In accordance with yet another option, a first isolation web 11 and a second isolation web 12 can be embodied as a continuous unit, which is shown for example in FIG. 14A. The unit can have a hinge 15, by means of which the isolation webs 11 and 12 are movable relative to one another before they are mounted on a circuit board 200. For this purpose, the isolation webs 11 and 12 can for example consist of a uniform material, for example plastic, and be embodied in an integral fashion. In this case, the unit can be produced in a simple manner by molding or injection molding. The hinge 15 can consist of an incision in the unit that forms a narrow, elastic connection web 16 between the isolation webs 11 and 12, which connection web can perform the function of a hinge on account of the elasticity of the uniform material of the unit.

Figure 14B:
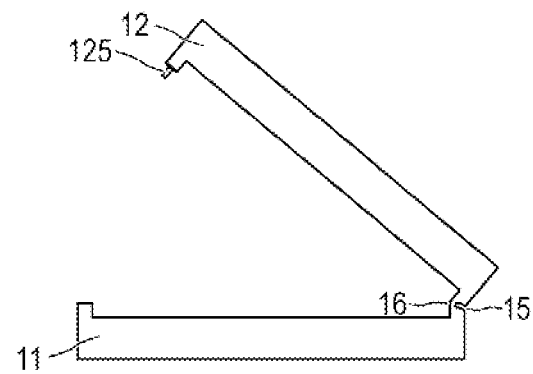
FIG. 14B shows the isolation webs in accordance with FIG. 14A in a swung-open state.
Figure 14C:
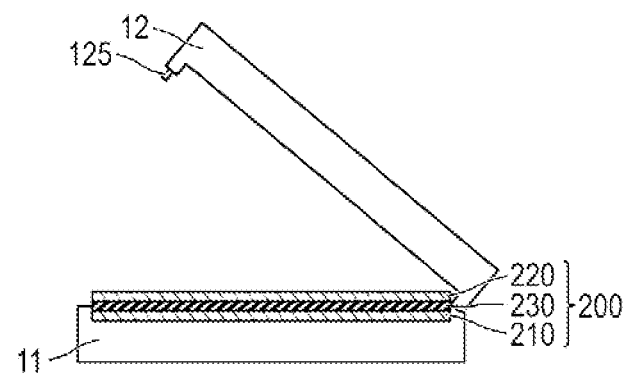
FIG. 14C shows the isolation webs in accordance with FIG. 14B after a circuit board has been inserted.

FIG. 14B shows the unit in accordance with FIG. 14A in a swung-open state, such that a circuit board 200 can be inserted into the unit, which is illustrated in FIG. 14C. Optionally, an arbitrary one of the first and second isolation webs 11, 12 can have a pin 125, which, after folding-together, engages into an opening formed in the other of the isolation webs 11, 12. In this case, the pin 125 can optionally have an oversize relative to the opening and be press-fitted into the opening, thus giving rise to a force-locking connection between the free ends of the isolation webs 11 and 12.

Likewise, a latching hook can be formed at a free end of an arbitrary one of the isolation webs 11, 12, which latching hook latches with the free end of the other of the isolation webs 11, 12 during folding-together.

Figure 14D:
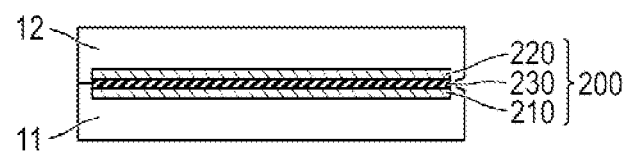
FIG. 14D shows the isolation webs in accordance with FIG. 14C after the isolation webs have been closed to form a unit which is closed in a ring-shaped fashion and which surrounds the circuit board.

After folding-together, the unit comprising the two isolation webs 11 and 12 can form a ring that surrounds the circuit board 200 in a ring-shaped fashion, which is illustrated in FIG. 14D. The ring can be embodied in an integral fashion, as shown, but also in a multipartite fashion.

Figure 15A:
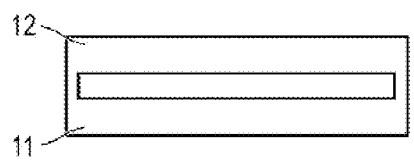
FIG. 15A shows a side view of two continuous isolation webs which form a unit embodied as a closed ring.
Figure 15B:
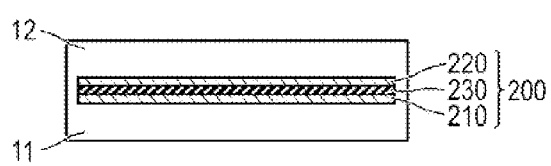
FIG. 15B shows a sectional view of a circuit board after the unit in accordance with FIG. 15A has been pushed onto the circuit board in such a way that it surrounds the circuit board in a ring-shaped fashion.

In accordance with another variant, shown in FIG. 15A, a unit having a first isolation web 11 and a second isolation web 12 can also be embodied as a closed ring that is pushed onto the circuit board 200 before the circuit board 200 is mounted on the power semiconductor module 100. FIG. 15B shows the unit pushed onto the circuit board 200.

Figure 16:
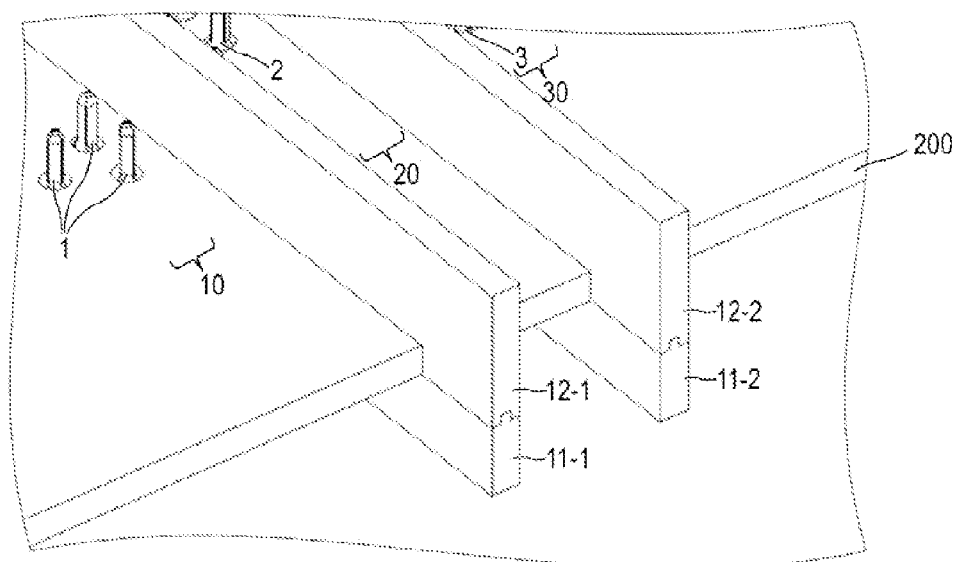
FIG. 16 shows a perspective view of a portion of a circuit board having two pairs of isolation webs, each of which pairs is mounted on the circuit board in a manner corresponding to the pair of isolation webs in accordance with FIG. 15B.

As is furthermore shown with reference to FIG. 16, a plurality of terminal groups 10, 20, 30 can be present on a circuit board 200, and in each case at least one isolation web 11-1, 12-1 and 11-2, 12-2 is arranged between two different pairs of terminal groups 10, 20, 30, here between the terminal groups 10 and 20 and respectively between the terminal groups 20 and 30, as was explained above. In the example in FIG. 16, the fixing of the isolation webs 11-1, 12-1, 11-2, 12-2 to the circuit board 200 is carried out merely by way of example in accordance with FIGS. 13A and 13B. All other variants explained can likewise be chosen as well, however.

Figure 17:
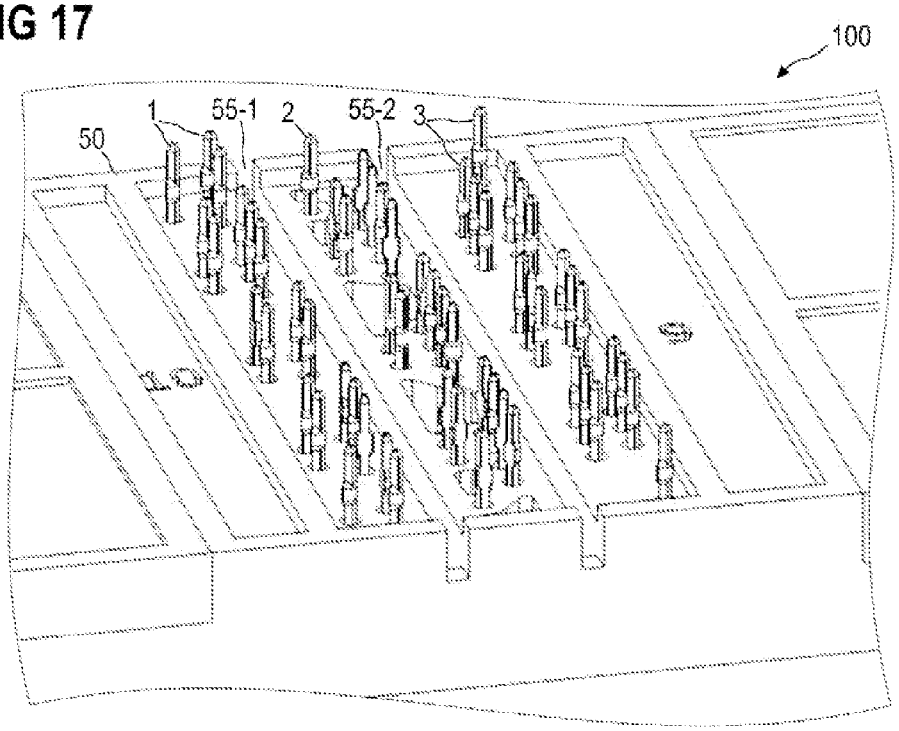
FIG. 17 shows a perspective view of a portion of a power semiconductor module comprising three terminal groups arranged alongside one another, wherein the module housing has a trench for receiving an isolation web between respectively two adjacent terminal groups.

Accordingly, an associated semiconductor module 100 can then also have two trenches 55-1 and 55-2, of which one (55-1) is arranged between the terminal groups 10 and 20 and the other (55-2) is arranged between the terminal groups 20 and 30, which is illustrated in FIG. 17.

Figure 18A:
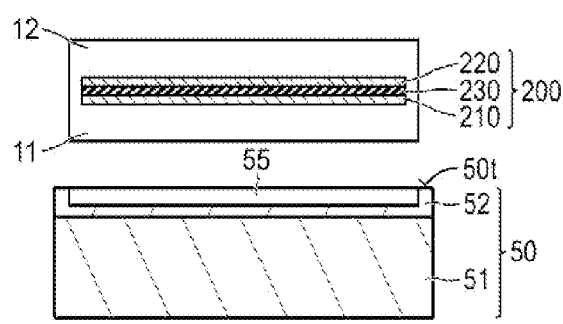
FIG. 18A shows a sectional view through a power semiconductor module system during the mounting of a circuit board provided with at least one isolation web on a semiconductor module.
Figure 18B:
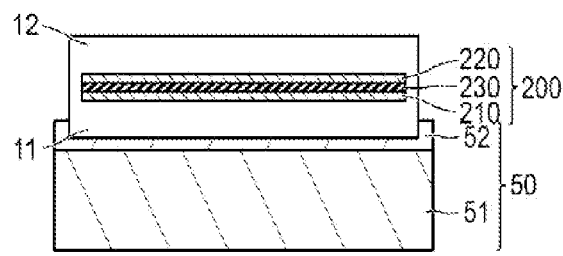
FIG. 18B shows the power semiconductor module arrangement formed after the mounting in accordance with FIG. 18A, in which arrangement an isolation web engages into a trench of the module housing.

FIGS. 18A and 18B also show, on the basis of the example of a circuit board 200 equipped with at least one first isolation web 11 in accordance with FIG. 15B, how the first isolation web 11 descends into the trench 55 with an accurate fit when the circuit board 200 is mounted on the power semiconductor module 100.

Figure 19:
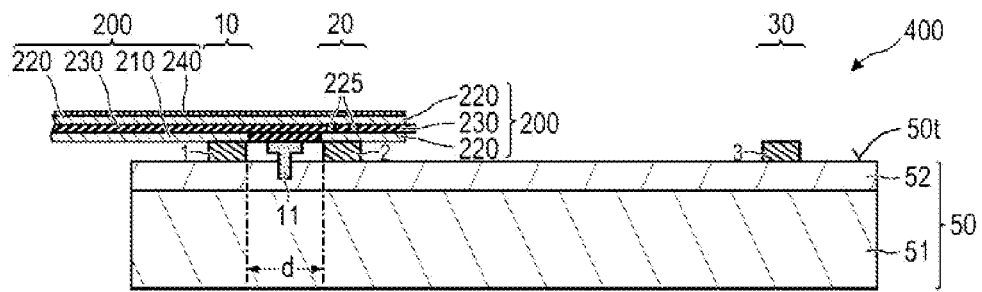
FIG. 19 shows a sectional view through a power semiconductor module arrangement in which the circuit board is provided with an isolation web only at its side facing the semiconductor module.

As is evident from the example in accordance with FIG. 19, it is also possible for only one first isolation web 11 to be led through between two terminal groups 10 and 20, which isolation web had already been fixed to the circuit board 200 before the mounting of the circuit board 200 on the power semiconductor module 100 and, after the mounting of the circuit board 200 on the power semiconductor module 100, is situated on the side of the circuit board 200 facing the power semiconductor module 100 and descends into the trench 55.

Independently thereof, in the case of the power semiconductor module arrangement 400 in accordance with FIG. 19, the electrical terminals 1, 2 and 3 are not embodied as press-fit terminals and accordingly are not led through the circuit board 200. Instead, they respectively make contact with one of the electrodes 210 and 220 on the underside of the circuit board 200 facing the power semiconductor module 100. For further interconnection of the electrode 220, the circuit board 200 can have plated-through holes 225, for example.

Figure 20:
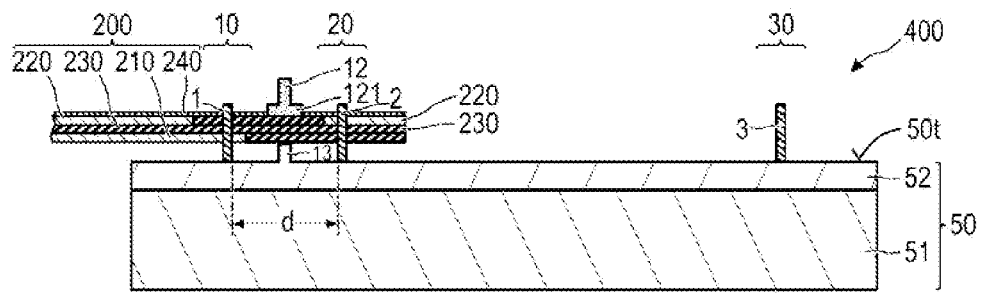
FIG. 20 shows a sectional view through a power semiconductor module arrangement in which the circuit board is provided with an isolation web only at its side facing away from the semiconductor module, while a further isolation web is formed at that side of the module housing which faces the circuit board.

In accordance with yet another variant, illustrated with reference to FIG. 20, it is also possible for only one second isolation web 12 to be led through the two terminal groups 10 and 20, which isolation web had already been fixed to the circuit board 200 before the mounting of the circuit board 200 on the power semiconductor module 100 and, after the mounting of the circuit board 200 on the power semiconductor module 100, is situated on the side of the circuit board 200 facing away from the power semiconductor module 100.

In such configurations, an electrically insulating third isolation web 13 can be present, which is embodied as part of the module housing 50 or is fixedly connected to the module housing 50 and is arranged between the first terminal group 10 and the second terminal group 20. After the circuit board 200 has been mounted on the power semiconductor module 100, the third isolation web 13 bears on the side of the circuit board 200 facing the power semiconductor module 100 and/or is adhesively bonded to it by means of an adhesive that completely seals a gap between the third isolation web 13 and the circuit board 200.

Figure 21:
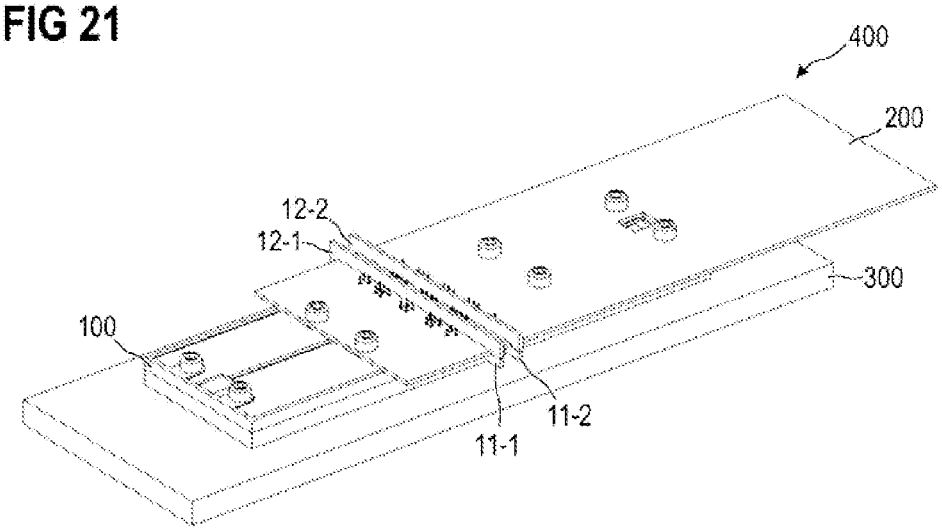
FIG. 21 shows a perspective view of a power semiconductor module arrangement comprising a power semiconductor module, on which a circuit board provided with isolation webs is mounted.

FIG. 21 shows an overall view of a power semiconductor module arrangement 400 comprising a power semiconductor module 100, on which a circuit board 200 is mounted, to which circuit board at least one isolation web 11-1, 11-2, 12-1, 12-2 was fixed prior to mounting on the power semiconductor module 100. Optionally, the circuit board 200 can be connected to the power semiconductor module 100 by one or a plurality of connecting means, for example by a screen.

In accordance with a further option, a heat sink 300 can also be mounted on the power semiconductor module 100 on that side thereof which faces away from the circuit board 200. The fixing of the power semiconductor modules 100 to the heat sink 300 can likewise be carried out in any desired manner, for example by screwing.

The configuration of a circuit board 200 is arbitrary, in principle; it can be embodied for example as a printed circuit board or as a laminated bus bar, in which the two electrodes 210 and 220 are laminated in a manner electrically isolated from one another to form a composite assembly.

There can be situated in the interior of the module housing 50 at least one power semiconductor component, for example a MOSFET, an IGBT, a JFET, a thyristor, a diode, or any other power component. Using the at least one power semiconductor component, the semiconductor module 100 can contain a controllable semiconductor switch, a half-bridge, two half-bridges (e.g. an H-bridge), three half-bridges, or any other configuration.

Figure 22:
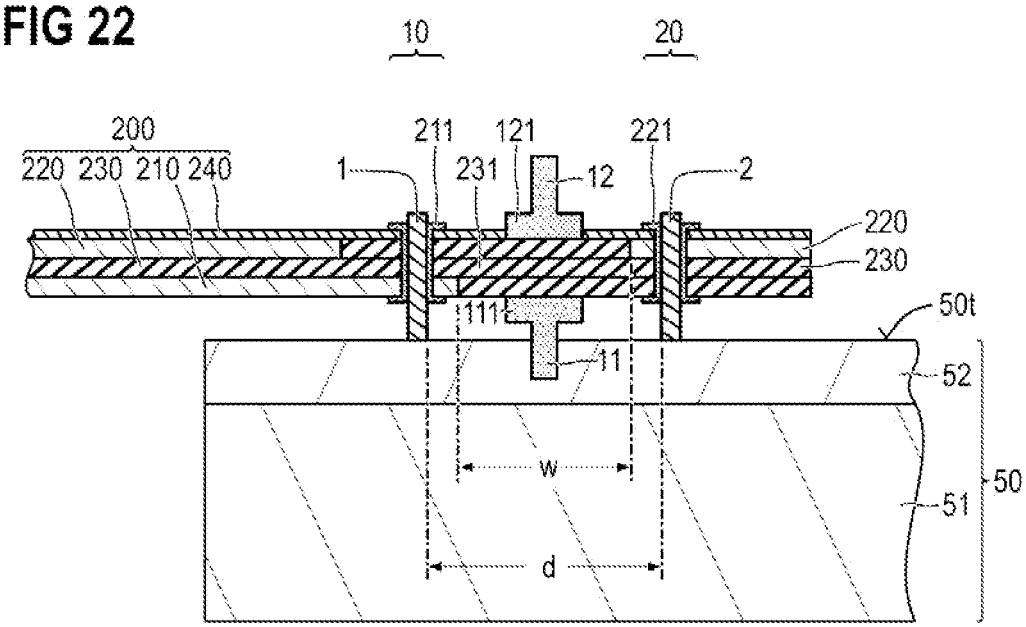
FIG. 22 shows an enlarged portion of the power semiconductor module arrangement in accordance with FIG. 4.

During the operation of a power semiconductor module arrangement 400 according to the present invention, a high electrical potential difference can be present at least between the first electrical terminals 1 of the first terminal group 10 and the second electrical terminals 2 of the second terminal group 20, between which the first isolation web 11 and/or the second isolation web 12 run(s), said electrical potential difference then also being present between the electrodes 210 and 220 of the circuit board 200. On account of plated-through holes or through holes 201, 202 of the circuit board 200 said potential difference can also be present across a portion 231 of the isolation carrier 230 that is situated between the terminal groups 10 and 20, which are shown by way of example on the basis of the enlarged portion of the power semiconductor module arrangement in accordance with FIG. 4 that is shown in FIG. 22. However, the criteria explained in this context also apply to all other configurations. By way of example, the isolation carrier 230 can have in the portion 231 glass fibers along which the potential difference is dropped. If power semiconductor components having a maximum permissible reverse voltage of 600 V are arranged in the module housing 50, then operating voltages (DC or AC voltages) of 200 V to 450 V can be present between the terminal groups 10 and 20. In the case of power semiconductor components having a maximum permissible reverse voltage of 1200 V, operating voltages of 400 V to 900 V can even be present between the terminal groups 10 and 20, and even operating voltages of 600 V to 1400 V in the case of power semiconductor components having a maximum permissible reverse voltage of 1700 V. Momentary voltage spikes, in the extreme case, can reach a maximum permissible operating voltage $U_{max}$ that is permitted to be present between the terminal groups 10 and 20. In this case, the electrical components installed in the power semiconductor module 100 must not be destroyed. The power semiconductor components can be, for example, diodes or controllable semiconductor components in which the current through a load path (e.g. between emitter and collector, between source and drain or between anode and cathode) is controlled by means of a control terminal (e.g. a gate or base terminal). Suitable controllable power semiconductor components are, for example, IGBTs, MOSFETs, JFETs, thyristors, HEMTs, etc. The maximum permissible reverse voltages indicated relate, depending on the component, to the maximum permissible reversible voltage between emitter and collector, between source and drain, or between anode and cathode. By way of example, at least one power semiconductor component having a maximum permissible reversible voltage of at least 300 V or of at least 600 V can be arranged in the housing 50 of the power semiconductor module 100.

The use of one or a plurality of isolation webs 11, 12 makes it possible to significantly reduce the (smallest) distance w between the first terminal group 10 including those elements of the circuit board 200 which are electrically conductively connected thereto (electrode 210, plated-through holes 211, soldering lands, etc.), on the one hand, and the second terminal group 20 including those elements of the circuit board 200 which are electrically conductively connected thereto (electrode 220, plated-through holes 221, soldering lands, etc.) on the other hand, in comparison with conventional power semiconductor module arrangements. The distance w is designated hereinafter as "electrode group distance". The electrode group distance w indicates the (smallest) distance between a first electrode group and a second electrode group. In this case, the first electrode group comprises all elements which, as long as the circuit board 200 is mounted on the semiconductor module 100, are permanently electrically conductively connected to the first electrical terminals 1 of the first terminal group 10. Correspondingly, the second electrode group comprises all elements which, as long as the circuit board 200 is mounted on the semiconductor module 100, are permanently electrically conductively connected to the second electrical terminals 2 of the second terminal group 20. In each of the electrode groups, all elements electrically conductively connected to one another can consist of metal. As a result, the elements of an electrode group have substantially the same electrical potential during the operation of the power semiconductor arrangement. If an electrical potential difference is present between the first terminal group 10 and the second terminal group 20 during the operation of the power semiconductor arrangement, then it is dropped at the electrode group distance w.

By way of example, the distance d between the terminal groups 10 and 20 of the power semiconductor modules 100 which distance is also designated as "terminal group distance" hereinafter, can be chosen to be $d<U_{max} \cdot 0.0070$ mm/V or even to be $d<U_{max} \cdot 0.0045$ mm/V, where $U_{max}$ is the maximum permissible operating voltage which is permitted to be applied between the first terminal group 10 and the second terminal group 20 during the operation of the power semiconductor arrangement (i.e. comprising circuit board 200 mounted on the power semiconductor module 100) without resulting in disruption of the electrical components installed in the power semiconductor module 100.

By way of example, the distance d between two adjacent terminal groups 10 and 20 for $U_{max}$=1200 V can be less than 7 mm (e.g. in the range of 3 mm to 5 mm), or for $U_{max}$=1700 V can be less than 11.5 mm (e.g. in the range of 5 mm to 7 mm). Independently of these criteria, the distance d of the voltage present between the first terminal group 10 and second terminal group 20 during operation can be at least 1.5 mm.

The distances between the electrodes 210 and 220 of the circuit board 200 can be shortened within an insulating layer of the isolation carrier 230 horizontally along structures of the insulating layer (e.g. glass fibers, glass fiber fabrics) within the circuit board 200 approximately to the minimum distances required to bring about a sufficient electrical isolation within the circuit board 200. Fault mechanisms in the circuit board 200 such as "CAF" (CAF=Conductive Anodic Filament) are taken into account here. In the case of glass fibers or glass fiber fabrics, these mechanisms proceed preferentially along glass fibers. Therefore, the electrode group distance w must not become too short. On account of the present invention, however, said electrode group distance can be chosen to be significantly shorter than the minimum creepage path required if the maximum permissible operating voltage $U_{max}$ is present between the electrode groups.

In the case of the present invention, a power semiconductor arrangement can be configured such that no straight path running only through air is present between the first electrical terminals 1 of the first terminal group 10 and the second electrical terminals 2 of the second terminal group 20, which, after all, are at different electrical potentials during operation. To put it another way, this means that there is a "line of sight" nowhere between the first electrical terminals 1 of the first terminal group 10 and the second electrical terminals 2 of the second terminal group 20.

Generally, but not necessarily, a power semiconductor module according to the present invention, can have a rapidly switching commutation circuit (for example a half-bridge, an H-bridge, a 3- or multi-level circuit, etc.). A power semiconductor module can likewise be part of a rapidly switching commutation circuit. By way of example, two semiconductor modules can in each case contain a logic switch with one or a plurality of semiconductor chips electrically connected in parallel, and the logic switches can be interconnected to form a half-bridge. One logic switch can then form a DC+ circuit, for example, and the other a DC− circuit.

As used herein, to the extent to which expressions such as, for instance, "contain", "have", "having" or variants thereof are used either in the detailed description or in the claims, it should be understood that such expressions are intended to be inclusive in a manner similar to the expressions "encompass", "comprise". The expression "by way of example" is intended to denote merely an example instead of the best or optimum example in accordance with any given criterion.

Even if a specific feature or a specific aspect of an embodiment of the invention may have been disclosed with regard to only one of a plurality of implementations, such a feature or such an aspect can be combined with one or a plurality of other features or aspects of the other implementations, as may be desirable and advantageous for an arbitrary given or determined application.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module system, comprising:
a power semiconductor module comprising:
  a module housing having a top side;
  a first terminal group having at least one first electrical terminal, or having at least two first electrical terminals which are permanently electrically conductively connected to one another;
  a second terminal group having at least one second electrical terminal, or having at least two second electrical terminals which are permanently electrically conductively connected to one another;
a circuit board having a first electrode and a second electrode, the circuit board being mountable on the power semiconductor module in such a way that in the mounted state:
  each first terminal is electrically conductively connected to the first electrode; and
  each second terminal is electrically conductively connected to the second electrode,
wherein the power semiconductor module system further comprises one or both of the following isolation webs:

a first isolation web fixed to the circuit board even in an unmounted state and arranged between the first terminal group and the second terminal group in a mounted state; and a second isolation web fixed to the circuit board even in the unmounted state and arranged between the first terminal group and the second terminal group in the mounted state on that side of the circuit board which faces away from the power semiconductor module.

2. The power semiconductor module system of claim 1, wherein:
the module housing includes a trench that extends into the module housing proceeding from the top side between the first terminal group and the second terminal group; and
the first isolation web engages into the trench in the mounted state.

3. The power semiconductor module system of claim 2, wherein the trench has a sidewall formed by the module housing, is closed in a ring-shaped fashion, and surrounds the first isolation web in a ring-shaped fashion in the mounted state.

4. The power semiconductor module system of claim 2, wherein the trench has a course direction and is delimited by the module housing neither in the course direction nor counter to the course direction.

5. The power semiconductor module system of claim 2, wherein the trench has a course direction and the module housing has a greater width than the circuit board in the mounted state in the course direction at least in the region of the trench.

6. The power semiconductor module system of claim 2, wherein the trench has a course direction and the module housing has a smaller width than the circuit board in the mounted state in the course direction at least in the region of the trench.

7. The power semiconductor module system of claim 1, wherein the first isolation web and the second isolation web together form an integral or multipartite ring-shaped structure that surrounds the circuit board in a ring-shaped fashion.

8. The power semiconductor module system of claim 1, wherein the first isolation web and the second isolation web are embodied in a continuous fashion and form a unit that surrounds the circuit board in a ring-shaped fashion.

9. The power semiconductor module system of claim 8, wherein the unit is embodied as a closed ring that is pushed onto the circuit board.

10. The power semiconductor module system of claim 1, wherein at least one of:
the first isolation web has first alignment pins that respectively engage into a corresponding first alignment opening of the circuit board; and
the second isolation web has second alignment pins that respectively engage into a corresponding second alignment opening of the circuit board.

11. The power semiconductor module system of claim 1, wherein at least one of:
the first isolation web is adhesively bonded to the circuit board; and
the second isolation web is adhesively bonded to the circuit board.

12. The power semiconductor module system of claim 1, further comprising a third isolation web which is embodied as part of the module housing or fixedly connected to the module housing and which is arranged between the first terminal group and the second terminal group.

13. The power semiconductor module system of claim 12, wherein the third isolation web is adhesively bonded to the circuit board.

14. The power semiconductor module system of claim 1, wherein one of:
the first terminals and the second terminals are embodied in each case as soldering terminals, wherein in the mounted state the first terminals are soldered to the first electrode and the second terminals are soldered to the second electrode;
the first terminals and the second terminals are embodied in each case as welding terminals, wherein in the mounted state the first terminals are welded to the first electrode and the second terminals are welded to the second electrode;
the first terminals and the second terminals are embodied in each case as screw terminals, wherein in the mounted state the first terminals are screwed to the first electrode and the second terminals are screwed to the second electrode;
the first terminals and the second terminals are embodied in each case as press-fit terminals according to DIN 41611-9:1987-12 or according to DIN EN (IEC) 60352-5, 2008-11, wherein in the mounted state each of the first terminals is respectively press-fitted into a corresponding first opening of the first electrode and each of the second terminals is respectively press-fitted into a corresponding second opening of the second electrode; and
the first terminals and the second terminals are embodied in each case as spring contacts, wherein in the mounted state each of the first terminals is pressed against the first electrode resiliently and with formation of an electrical pressure contact connection and each of the second terminals is pressed against the second electrode resiliently and with formation of an electrical pressure contact connection.

15. The power semiconductor module system of claim 1, wherein:
the power semiconductor module has a maximum permissible operating voltage that is permitted to be present between the first terminal group and the second terminal group; and
the first terminal group and the second terminal group have a terminal group distance that satisfies at least one or an arbitrary combination of the following criteria, provided that these criteria are not mutually exclusive:
the terminal group distance is less than (0.0070 mm/V) times the maximum permissible operating voltage;
the terminal group distance is less than (0.0045 mm/V) times the maximum permissible operating voltage;
the terminal group distance is less than 7 mm and the maximum permissible operating voltage is 1200 V;
the terminal group distance is less than 11.5 mm and the maximum permissible operating voltage is 1700 V;
the terminal group distance is at least 1.5 mm.

16. A method for producing a power semiconductor module arrangement, the method comprising:
providing a power semiconductor module system which comprises:
a power semiconductor module comprising:
a module housing having a top side;
a first terminal group having at least one first electrical terminal, or having at least two first electrical terminals which are permanently electrically conductively connected to one another;

a second terminal group having at least one second electrical terminal, or having at least two second electrical terminals which are permanently electrically conductively connected to one another;

a circuit board having a first electrode and a second electrode, the circuit board being mountable on the power semiconductor module in such a way that in the mounted state:

each first terminal is electrically conductively connected to the first electrode; and each second terminal is electrically conductively connected to the second electrode, wherein the power semiconductor module system further comprises one or both of the following isolation webs:

a first isolation web fixed to the circuit board even in an unmounted state and arranged between the first terminal group and the second terminal group in a mounted state; and a second isolation web fixed to the circuit board even in the unmounted state and arranged between the first terminal group and the second terminal group in the mounted state on that side of the circuit board which faces away from the power semiconductor module;

mounting the circuit board on the power semiconductor module in such a way that in the mounted state each of the first terminals is electrically conductively connected to the first electrode and each of the second terminals is electrically conductively connected to the second electrode.

17. The method of claim 16, wherein at least one of:

the power semiconductor module system has a first isolation web, which is fixedly connected to the circuit board before the power semiconductor module is mounted on the circuit board; and the power semiconductor module system has a second isolation web, which is fixedly connected to the circuit board before the power semiconductor module is mounted on the circuit board.

18. The method of claim 16, wherein at least one of:

the power semiconductor module system has a first isolation web having first alignment pins, wherein the first isolation web is fixedly connected to the circuit board before the circuit board is mounted on the power semiconductor module, such that the first alignment pins respectively engage into a corresponding first alignment opening of the circuit board and remain in engagement with the first alignment openings during the mounting of the circuit board on the power semiconductor module; and the power semiconductor module system has a second isolation web having second alignment pins wherein the second isolation web is fixedly connected to the circuit board before the circuit board is mounted on the power semiconductor module such that the second alignment pins respectively engage into a corresponding second alignment opening of the circuit board and remain in engagement with the second alignment openings during the mounting of the circuit board on the power semiconductor module.

19. The method of claim 16, wherein the power semiconductor module system has a first isolation web and a second isolation web, which are fixedly connected to the circuit board and which are connected to one another in a movable fashion before they are mounted on the circuit board.

* * * * *